(12) United States Patent
Iizuka et al.

(10) Patent No.: US 8,004,157 B2
(45) Date of Patent: Aug. 23, 2011

(54) PIEZOELECTRIC RESONATOR PLATE AND PIEZOELECTRIC RESONATOR DEVICE

(75) Inventors: Minoru Iizuka, Kakogawa (JP);
Tatsuya Murakami, Kakogawa (JP);
Syunsuke Satoh, Kakogawa (JP);
Takashi Shirai, Kakogawa (JP);
Hiroyuki Ishihara, Kakogawa (JP);
Tomo Fujii, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 172 days.

(21) Appl. No.: 11/885,260

(22) PCT Filed: Mar. 2, 2006

(86) PCT No.: PCT/JP2006/303976
§ 371 (c)(1),
(2), (4) Date: Aug. 29, 2007

(87) PCT Pub. No.: WO2006/114936
PCT Pub. Date: Nov. 2, 2006

(65) Prior Publication Data
US 2008/0265717 A1    Oct. 30, 2008

(30) Foreign Application Priority Data

Apr. 18, 2005    (JP) .................................. 2005-119307

(51) Int. Cl.
*H01L 41/08*    (2006.01)
(52) U.S. Cl. ........................................ 310/344; 310/370
(58) Field of Classification Search .................. 310/344, 310/348, 367, 368
See application file for complete search history.

(56) References Cited

U.S. PATENT DOCUMENTS

| 4,234,811 | A | * | 11/1980 | Hishida et al. ................. 310/348 |
| 4,421,621 | A | * | 12/1983 | Fujii et al. ................. 204/192.12 |
| 4,639,631 | A | * | 1/1987 | Chason et al. ................. 310/344 |
| 5,030,875 | A | * | 7/1991 | Knecht ................. 310/346 |
| 5,235,240 | A | * | 8/1993 | Morita et al. ................. 310/365 |
| 5,444,325 | A | * | 8/1995 | Haas et al. ................. 310/368 |
| 5,473,216 | A | * | 12/1995 | Brosig et al. ................. 310/346 |
| 5,596,243 | A | * | 1/1997 | Tsuru et al. ................. 310/348 |
| 5,894,185 | A | * | 4/1999 | Asada et al. ................. 310/368 |
| 6,507,139 | B1 | * | 1/2003 | Ishino et al. ................. 310/348 |
| 6,629,922 | B1 | * | 10/2003 | Puria et al. ................. 600/25 |
| 6,833,654 | B2 | * | 12/2004 | Rubach ................. 310/344 |
| 7,034,441 | B2 | * | 4/2006 | Ono et al. ................. 310/344 |
| 2002/0158699 | A1 | | 10/2002 | Iizuka et al. |
| 2004/0095044 | A1 | | 5/2004 | Yagishita |

FOREIGN PATENT DOCUMENTS

| JP | 2002-141765 | 5/2002 |
| JP | 2003-017976 | 1/2003 |
| JP | 2003-060474 | 2/2003 |
| JP | 2004-180274 | 6/2004 |

(Continued)

*Primary Examiner* — Mark Budd
(74) *Attorney, Agent, or Firm* — Marvin A. Motsenbocker; Mots Law, PLLC

(57) ABSTRACT

An electrode forming region for providing lead electrodes (65a, 65b) is provided on a crystal resonator plate (2). Opposed side surfaces (67a, 67b) of a substrate (6) are formed and inclined in the same direction with respect to a front major surface (63). Also, an adhesion reinforcing portion (7) for reinforcing adhesion to a conductive adhesive (5) is provided in the electrode forming region for the lead electrodes (65a, 65b). For example, the adhesion reinforcing portion (7) is a notch portion which is cut and formed in the opposed side surfaces (67a, 67b). Thereby, an adhesion strength of the crystal resonator plate (2) and the conductive adhesive (5) is increased.

17 Claims, 7 Drawing Sheets

FOREIGN PATENT DOCUMENTS

| | | |
|---|---|---|
| JP | 2004-200910 | 7/2004 |
| JP | 2004-320297 | 11/2004 |
| JP | 2004-328338 | 11/2004 |
| JP | 2004-357080 | 12/2004 |
| JP | 2005-136705 | 5/2005 |
| WO | 01/67600 | 9/2001 |

* cited by examiner (a)

(b)

(a)

(b)

Table.1

(a)

(b)

Table.2

(a)

(b)

PIEZOELECTRIC RESONATOR PLATE AND PIEZOELECTRIC RESONATOR DEVICE

TECHNICAL FIELD

The present invention relates to a piezoelectric resonator plate and a piezoelectric resonator device. More particularly, the present invention relates to adhesion of a piezoelectric resonator plate to a base which is a housing for a piezoelectric resonator device.

BACKGROUND ART

Piezoelectric resonator devices include, for example, tuning fork crystal resonators and the like. In such piezoelectric resonator devices, their housings are composed of a base and a lid. A crystal resonator plate which is adhered to and held on the base is hermetically enclosed in the housing. The crystal resonator plate is adhered to the base using, for example, a conductive adhesive. By the conductive adhesive, continuity is established between an excitation electrode provided on a major surface of the crystal resonator plate and an electrode pad provided on the base (see, for example, Patent Document 1).

Patent Document 1 describes two tuning fork crystal resonators. In one tuning fork crystal resonator, a lower major surface at a base portion of a tuning fork crystal resonator plate is adhered to an electrode pad of a base via a conductive adhesive. Also, in the other tuning fork crystal resonator, a lower major surface and a side surface at a base portion of a tuning fork crystal resonator plate are adhered to an electrode pad of a base via a conductive adhesive.
Patent Document 1: JP 2004-200910 A

DISCLOSURE OF INVENTION

Problem to be Solved by the Invention

At present, electronic apparatuses comprising a piezoelectric resonator device as described above are becoming mobile. Mobile electronic apparatuses require an improvement in resistance to impact in a case where they are dropped. Therefore, at present, in a process of manufacturing piezoelectric resonator devices, a test for impact resistance is one of the important tests.

In the impact resistance test as used herein, a piezoelectric resonator device is dropped, and change amounts in characteristics (a frequency, a resistance value (CI value), etc.) of the piezoelectric resonator device between before and after the drop are measured, and based on the result of the measurement, pass or fail of the device is determined.

In the tuning fork crystal resonator described in Patent Document 1 described above, the lower major surface, or the lower major surface and the side surface, of the base portion of the tuning fork crystal resonator plate, and the electrode pad of the base are adhered together via a conductive adhesive. However, in the impact resistance test, the tuning fork crystal resonator plate may be peeled off or detached from the conductive adhesive in the tuning fork crystal resonator after being dropped. Therefore, an adhered state of a lead electrode of the tuning fork crystal resonator plate and the conductive adhesive becomes unstable, and as a result, the continuity state becomes unstable. Due to the unstable continuity state, change amounts in characteristics (a frequency, a resistance value (CI value), etc.) of the tuning fork crystal resonator become significant and exceed specified tolerable ranges of the respective characteristics, resulting in a defective tuning fork crystal resonator.

Therefore, to solve the above-described problems, an object of the present invention is to provide a piezoelectric resonator plate and a piezoelectric resonator device in which an adhesion strength when a piezoelectric resonator plate is adhered to an electrode pad of a base via a conductive adhesive is improved, thereby suppressing the piezoelectric resonator plate from being detached from the conductive adhesive.

Means for Solving Problem

In order to achieve the above-described object, a piezoelectric resonator plate according to the present invention is provided in which excitation electrodes having different potentials and lead electrodes connected to the excitation electrodes so as to electrically connect the excitation electrodes to external electrodes are provided on a substrate, and the lead electrodes are connected via a conductive adhesive to the external electrodes. In the piezoelectric resonator plate, an electrode forming region for providing the lead electrodes is set on the substrate, an adhesion reinforcing portion for reinforcing adhesion to the conductive adhesive is provided in the electrode forming region for the lead electrodes, one major surface of the substrate and the adhesion reinforcing portion constitute an adhesion surface to the conductive adhesive, and at least a portion of the adhesion surface of the adhesion reinforcing portion is formed and inclined with respect to the other major surface so as to face the other major surface.

According to the present invention, the electrode forming region for the lead electrodes is provided on the substrate; the adhesion reinforcing portion is provided in the electrode forming region for the lead electrodes; the one major surface and the adhesion reinforcing portion constitute the adhesion surface to the conductive adhesive; and at least a portion of the adhesion surface of the adhesion reinforcing portion is formed and inclined with respect to the other major surface so as to face the other major surface. Therefore, an adhesion strength when the piezoelectric resonator plate is adhered via the conductive adhesive to the external electrode can be increased, thereby making it possible to suppress the piezoelectric resonator plate from being detached from the conductive adhesive toward above the other major surface of the substrate. As a result, it is possible to suppress change amounts of a frequency and a resistance value of a piezoelectric resonator device comprising the piezoelectric resonator plate. Also, according to the present invention, the one major surface and the adhesion reinforcing portion constitute the adhesion surface to the conductive adhesive. Therefore, as is different from the case where the conductive adhesive reaches the other major surface of the piezoelectric resonator plate, the conductive adhesive is not provided in a gap between the piezoelectric resonator plate and the lid, so that the electrode short circuit of the piezoelectric resonator device can be suppressed. Also, since the conductive adhesive is not provided in the gap between the piezoelectric resonator plate and the lid, the gap between the piezoelectric resonator plate and the lid can be suppressed to a minimum level, thereby making it possible to reduce a size of the piezoelectric resonator device. Also, since the adhesion surface of the adhesion reinforcing portion is an inclined surface which is inclined with respect to the major surface, adhesion to the conductive adhesive on the inclined surface makes it possible to press the piezoelectric resonator plate against the external electrode provided below the substrate via the conductive adhesive.

In the structure, an extended electrode portion formed by extending the lead electrode may be provided on the adhesion surface of the adhesion reinforcing portion.

In this case, in addition to the above-described operational effect, since the extended electrode portion is formed on the adhesion surface, the area of electrical contact with the conductive adhesive is increased, thereby making it possible to reduce the contact resistance.

In the structure, the extended electrode portion may be formed on an entirety of the adhesion surface of the adhesion reinforcing portion.

In this case, in addition to the above-described operational effect, since the extended electrode portion is formed on an entirety of the adhesion surface, the area of electrical contact with the conductive adhesive is further increased, thereby making it possible to further reduce the contact resistance.

In the structure, the extended electrode portion may be formed on at least a portion of the adhesion surface of the adhesion reinforcing portion.

In this case, in addition to the above-described operational effect, since the extended electrode portion is formed on at least a portion of the adhesion surface, the area of electrical contact with the conductive adhesive is increased, thereby making it possible to reduce the contact resistance. In addition, since the area of adhesion of the conductive adhesive and the piezoelectric resonator plate is secured, thereby making it possible to hold the adhesion strength.

Also, in order to achieve the above-described object, a piezoelectric oscillator according to the present invention is provided in which excitation electrodes having different potentials and lead electrodes connected to the excitation electrodes so as to electrically connect the excitation electrodes to external electrodes are provided on a substrate, and the lead electrodes are connected via a conductive adhesive to the external electrodes. In the piezoelectric oscillator, an electrode forming region for providing the lead electrodes is set on the substrate; an adhesion reinforcing electrode portion for reinforcing adhesion to the conductive adhesive and providing electrical contact is provided in the electrode forming region for the lead electrodes; and one major surface of the substrate and the adhesion reinforcing electrode portion constitute an adhesion surface which adheres to the conductive adhesive and provides electrical contact with the conductive adhesive.

According to the present invention, the electrode forming region for the lead electrodes is provided on the substrate; the adhesion reinforcing electrode portion is provided in the electrode forming region for the lead electrodes; and the one major surface and the adhesion reinforcing electrode portion constitute the adhesion surface to the conductive adhesive. Therefore, the adhesion area is increased, so that an adhesion strength when the piezoelectric resonator plate is adhered via the conductive adhesive to the external electrode can be increased, thereby making it possible to suppress the piezoelectric resonator plate from being detached from the conductive adhesive. As a result, it is possible to suppress change amounts of a frequency and a resistance value of a piezoelectric resonator device comprising the piezoelectric resonator plate. Also, according to the present invention, the one major surface and the adhesion reinforcing electrode portion constitute the adhesion surface to the conductive adhesive. Therefore, as is different from the case where the conductive adhesive reaches the other major surface of the piezoelectric resonator plate, the conductive adhesive is not provided in a gap between the piezoelectric resonator plate and the lid, so that the electrode short circuit of the piezoelectric resonator device can be suppressed. Also, since the conductive adhesive is not provided in the gap between the piezoelectric resonator plate and the lid, the gap between the piezoelectric resonator plate and the lid can be suppressed to a minimum level, thereby making it possible to reduce a size of the piezoelectric resonator device. Also, according to the present invention, since the adhesion reinforcing electrode portion is formed as the adhesion surface to the conductive adhesive, the area of electrical contact with the conductive adhesive can be increased, thereby making it possible to reduce the electrical resistance.

In the structure, at least a portion of the adhesion surface of the adhesion reinforcing electrode portion may be formed and inclined with respect to the other major surface so as to face the other major surface.

In this case, in addition to the above-described operational effect, since at least a portion of the adhesion surface of the adhesion reinforcing electrode portion is formed and inclined with respect to the other major surface so as to face the other major surface, it is possible to press the piezoelectric resonator plate against the external electrode to increase the adhesion strength when the piezoelectric resonator plate is adhered via the conductive adhesive to the external electrode, thereby making it possible to suppress the piezoelectric resonator plate from being detached from the conductive adhesive toward above the other major surface of the substrate.

In the structure, the excitation electrode, the lead electrode, and the adhesion reinforcing electrode portion may be formed by disposing and inclining one major surface of the substrate with respect to a vapor deposition source which is an electrode material, and performing vacuum vapor deposition.

In this case, in addition to the above-described operational effect, the adhesion reinforcing electrode portion can be formed by vacuum vapor deposition. Also, one major surface of the substrate is disposed and inclined with respect to the vapor deposition source which is an electrode material, so that the electrode material directly impinges on the side surface of the substrate, thereby efficiently forming the extended electrode portion.

In the structure, the excitation electrode, the lead electrode, and the adhesion reinforcing electrode portion may be formed by sputtering.

In this case, in addition to the above-described operational effect, the adhesion reinforcing electrode portion can be formed by sputtering. Also, according to sputtering, the vapor deposition material goes around significantly, so that the electrode material can be deposited on the side surface of the substrate, thereby efficiently forming the extended electrode portion.

In the structure, the adhesion surface to the conductive adhesive may include side surfaces of the substrate, and at least one pair of opposed side surfaces facing each other of the side surface of the substrate may be formed and inclined with respect to the other major surface so as to face the other major surface.

In this case, in addition to the above-described operational effect, the adhesion surface to the conductive adhesive includes the side surfaces of the substrate, and at least one pair of opposed side surfaces facing each other of the side surfaces of the substrate is formed and inclined with respect to the other major surface so as to face the other major surface. Therefore, preferably, the adhesion strength when the piezoelectric resonator plate is adhered via the conductive adhesive to the external electrode can be increased, thereby making it possible to suppress the piezoelectric resonator plate from being detached from the conductive adhesive toward above the other major surface of the substrate.

In the structure, the adhesion reinforcing portion or the adhesion reinforcing electrode portion may have a step portion, and the step portion may be included in the adhesion surface.

In this case, in addition to the above-described operational effect, the adhesion reinforcing portion or the adhesion reinforcing electrode portion has the step portion, and the step portion is included in the adhesion surface. Therefore, adhesion to the conductive adhesive on a top surface of the step portion makes it possible to preferably press the piezoelectric resonator plate against the external electrode provided below the substrate via the conductive adhesive.

In the structure, the adhesion reinforcing portion or the adhesion reinforcing electrode portion may be a notch portion which is cut and formed in the side surface of the substrate, and a notch wall surface of the notch portion may be the adhesion surface.

In this case, in addition to the above-described operational effect, the adhesion reinforcing portion or the adhesion reinforcing electrode portion is the notch portion, and the notch wall surface of the notch portion is the adhesion surface. Therefore, a holding force (anchor effect) can be caused to occur in adhesion of the conductive adhesive to the notch wall surface. As a result, the adhesion strength when the crystal resonator plate is adhered via the conductive adhesive to the external electrode can be increased.

In the structure, the adhesion reinforcing portion or the adhesion reinforcing electrode portion may be a through hole which is formed, penetrating between both the major surfaces of the substrate, and a through wall surface of the through hole may be the adhesion surface.

In this case, in addition to the above-described operational effect, the adhesion reinforcing portion or the adhesion reinforcing electrode portion is the through hole, and the through wall surface of the through hole is the adhesion surface. Therefore, a holding force (anchor effect) can be caused to occur in adhesion of the conductive adhesive to the through wall surface of the through hole. As a result, the adhesion strength when the crystal resonator plate is adhered via the conductive adhesive to the external electrode can be increased.

In the structure, the adhesion reinforcing portion or the adhesion reinforcing electrode portion may be a hole with a base surface which is formed on the one major surface of the substrate, and a wall surface of the hole with the base surface may be the adhesion surface.

In this case, in addition to the above-described operational effect, the adhesion reinforcing portion or the adhesion reinforcing electrode portion is the hole with the base surface, and the wall surface of the hole with the base surface is the adhesion surface. Therefore, a holding force (anchor effect) can be caused to occur in adhesion of the conductive adhesive to the wall surface of the hole with the base surface. As a result, the adhesion strength when the crystal resonator plate is adhered via the conductive adhesive to the external electrode can be increased.

In the structure, the substrate may be made of an anisotropic material.

In this case, in addition to the above-described operational effect, the substrate is made of an anisotropic material. Therefore, it is possible to easily form the adhesion surface in which at least the adhesion reinforcing portion (or the adhesion reinforcing electrode portion) is inclined with respect to the major surface along an axial direction inclined with respect to the major surface. Also, when the adhesion surface includes the side surface of the substrate, and at least one pair of opposed side surfaces facing each other of the side surfaces of the substrate is formed and inclined with respect to the other major surface in the same direction, by inclining the opposed side surface in the same direction along the axial direction inclined with respect to the major surface, it is possible to easily form the inclined side surface.

In the structure, the substrate may be formed of a crystal piece, and the lead electrode may be a multilayer film having a lowermost layer made of chromium.

In this case, in addition to the above-described operational effect, the substrate is formed of a crystal piece, and the lead electrode is formed of a multilayer film having a lowermost layer made of chromium. The adhesiveness of the crystal piece and chromium is high, so that the lead electrode can be easily formed on the substrate.

Also, in order to achieve the above-described object, a piezoelectric resonator device of the present invention is provided in which a housing is composed of a base and a lid, an inner portion of the housing being hermetically enclosed by adhering the base and the lid together, and electrode pads constituting the external electrodes are provided on the base inside the housing, and the adhesion surface of the piezoelectric resonator plate of the present invention is adhered to the electrode pads via a conductive adhesive.

According to the present invention, the housing is composed of the base and the lid, the inner portion of the housing being hermetically enclosed by adhering the base and the lid together, and the electrode pads constituting the external electrodes are provided on the base inside the housing, and the adhesion surface of the piezoelectric resonator plate of the present invention is adhered to the electrode pads via the conductive adhesive. Therefore, the adhesion strength of the piezoelectric resonator plate via the conductive adhesive to the base is increased, thereby making it possible to suppress the piezoelectric resonator plate from being detached from the conductive adhesive toward above the other major surface of the substrate. Specifically, regarding the impact resistance of the piezoelectric resonator plate with respect the six directions, it is possible to suppress the crystal resonator plate whose inner portion is hermetically enclosed from being detached from the conductive adhesive with respect to the six directions of the piezoelectric resonator plate. As a result, it is possible to suppress change amounts of a frequency and a resistance value of the piezoelectric resonator plate.

In the structure, a material for the conductive adhesive may include silicone, and the lead electrode of the piezoelectric resonator plate may be formed of a multilayer film having an uppermost layer made of chromium.

In this case, in addition to the above-described operational effect, the material for the conductive adhesive includes silicone, and the lead electrode of the piezoelectric resonator plate is formed of a multilayer film having an uppermost layer made of chromium. Since the adhesiveness of silicone and chromium is high, the conductive adhesive and the lead electrode can be easily adhered together.

EFFECTS OF THE INVENTION

According to the piezoelectric resonator plate and the piezoelectric resonator device of the present invention, the adhesion strength when the piezoelectric resonator plate is adhered via the conductive adhesive to the electrode pad of the base is increased, thereby making it possible to suppress the piezoelectric resonator plate from being detached from the conductive adhesive.

BRIEF DESCRIPTION OF DRAWINGS

FIG. 6 Table 1(b) shows the result of measurement of a frequency of the conventional crystal resonator.

FIG. 7. Table 2(b) shows the result of measurement of a CI value of the conventional crystal resonator.

Figure 1:
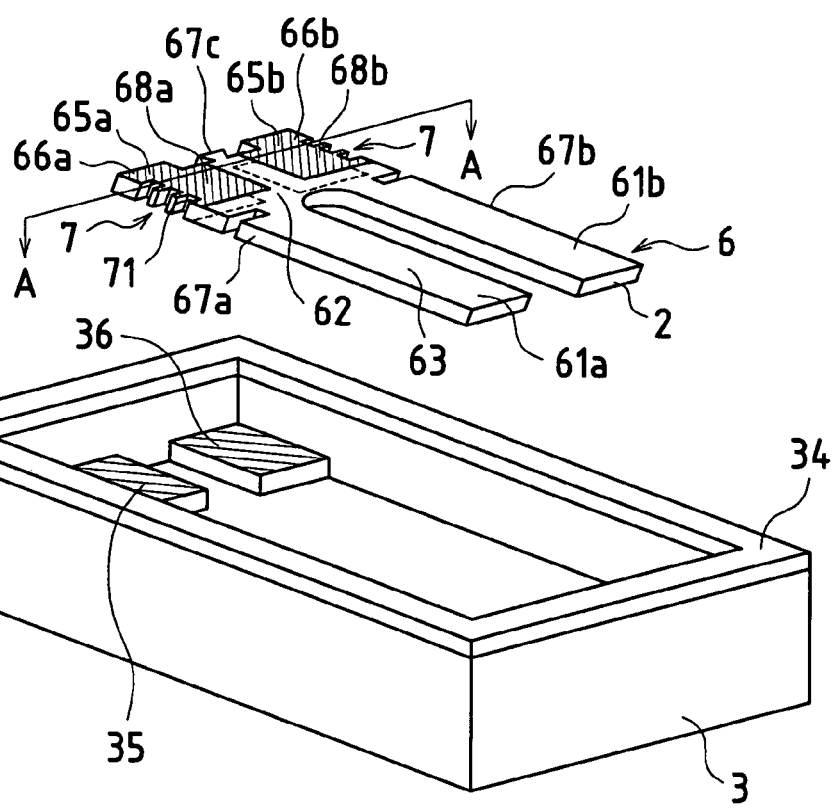
FIG. 1(a) is a schematic exploded perspective view of a base and a crystal resonator plate constituting a crystal resonator according to this embodiment.
FIG. 1(b) is a schematic cross-sectional view of the crystal resonator, taken along line A-A of FIG. 1(a).
FIG. 1(c) is a schematic cross-sectional view of a crystal resonator according to another embodiment, taken along line A-A of FIG. 1(a) in the direction of the arrow.
Figure 1:
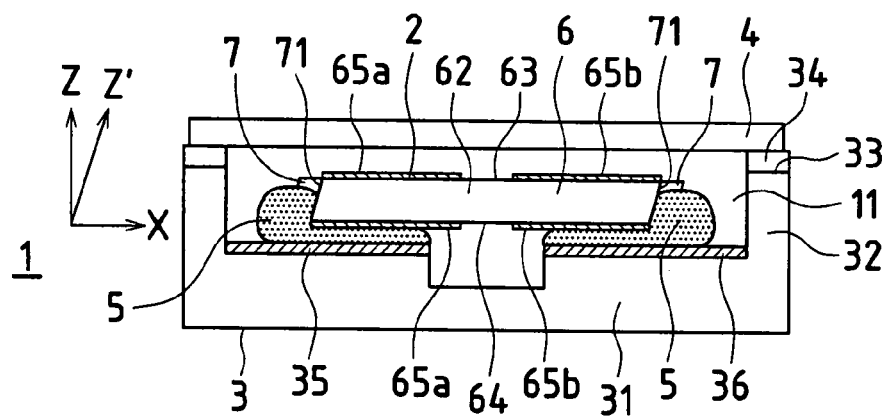
Figure 1:
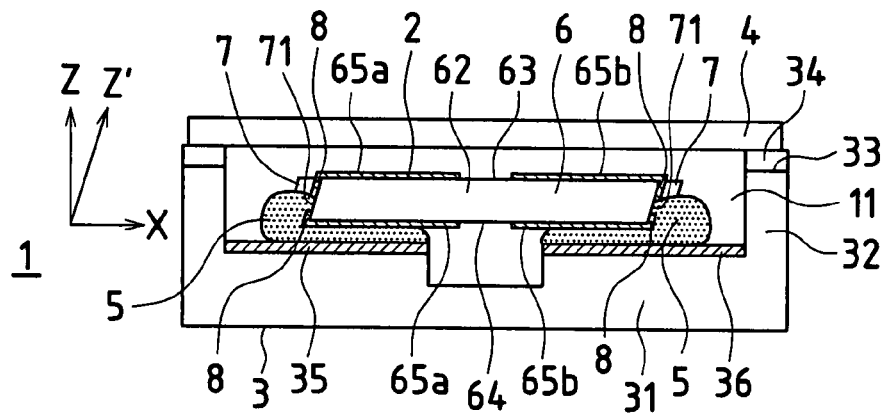

DESCRIPTION OF REFERENCE NUMERALS 1 crystal resonator
11 inner portion of a housing
2 crystal resonator plate
3 base
35, 36 electrode pad
4 lid
5 conductive adhesive
6 substrate
63 front major surface
64 rear major surface
65a, 65b lead electrode
67a, 67b opposed side surface
7 adhesion reinforcing portion
7b adhesion reinforcing electrode portion
71 notch wall surface
72 step portion
74 through wall surface
8 extended electrode portion
J vapor deposition source

BEST MODE FOR CARRYING OUT THE INVENTION

Hereinafter, embodiments of the present invention will be described with reference to the accompanying drawings. Note that, in the embodiments described below, the present invention is applied to a tuning fork crystal resonator (hereinafter referred to as a crystal resonator) as a piezoelectric resonator device.

As illustrated in FIG. 1, a crystal resonator 1 of this embodiment comprises a crystal resonator plate 2 (a piezoelectric resonator plate as used herein), a base 3 for holding the crystal resonator plate 2, and a lid 4 for hermetically enclosing the crystal resonator plate 2 held on the base 3.

In the crystal resonator 1, as illustrated in FIG. 1, the base 3 and the lid 4 are adhered together to form a housing, the crystal resonator plate 2 is adhered onto the base 3 in a housing inner portion 11, and the housing inner portion 11 is hermetically enclosed. In this case, as illustrated in FIG. 1(b), the base 3 and the crystal resonator plate 2 are adhered together using a conductive adhesive 5.

Next, each part of the crystal resonator 1 will be described.

The base 3 is made of, for example, a ceramic material, and as illustrated in FIG. 1, is formed in the shape of a box composed of a bottom surface portion 31, and a wall portion 32 extending upward from the bottom surface portion 31. Also, the wall portion 32 is provided along an outer circumference of a front surface of the bottom surface portion 31. A metallized layer 34 for adhering to the lid 4 is provided on an upper end portion 33 of the wall portion 32 of the base 3. Also, electrode pads 35 and 36 which are electrically connected to lead electrodes 65a and 65b (described below) of the crystal resonator plate 2 are provided at both end portions of one side of the bottom surface portion 31 in an inner portion (see the housing inner portion 11) of the base 3 which is composed of the bottom surface portion 31 and the wall portion 32. These electrode pads 35 and 36 are electrically connected to respective terminal electrodes (not shown) formed on a rear surface of the base 3, and are connected via these terminal electrodes to external apparatuses. Note that the electrode pads 35 and 36 and the terminal electrodes are formed by printing a metallization material, such as tungsten, molybdenum or the like, before burning these parts and the base 3 together, and for example, nickel plating and gold plating are provided thereon.

As illustrated in FIG. 1(b), the lid 4 is made of a metal material and formed in the shape of a cuboid (single board) having a rectangular shape as viewed from the top. A wax material (not shown) is formed on a lower surface of the lid 4, and is adhered to the base 3 by a technique, such as seam welding, beam welding or the like, so that a housing for the crystal resonator 1 is composed of the lid 4 and the base 3. Note that the housing inner portion 11 as used in this embodiment refers to a portion which is hermetically enclosed by the lid 4 and the base 3. Alternatively, the lid may be made of a ceramic material, and the housing inner portion 11 may be hermetically enclosed via a glass material.

As a material for the conductive adhesive 5, silicone containing a plurality of silver fillers is used. By curing the conductive adhesive 5, the plurality of silver fillers are bonded together into a conductive substance.

As illustrated in FIG. 1, the crystal resonator plate 2 is formed by etching a substrate 6 which is a crystal piece made of an anisotropic material. The substrate 6 is composed of two leg portions 61a and 61b (a first leg portion and a second leg portion), and a base portion 62. The two leg portions 61a and 61b are extended from the base portion 62.

On a front major surface 63 (the other major surface as used herein) of the crystal resonator plate 2, two excitation electrodes (a first excitation electrode and a second excitation electrode (not shown)) having different potentials, and the lead electrodes 65a and 65b which are led from the excitation electrodes so as to electrically connect these excitation electrodes to the electrode pads 35 and 36 (external electrodes as used herein), are provided. The lead electrodes 65a and 65b and the electrode pads 35 and 36 are adhered together via the conductive adhesive 5, so that the lead electrodes 65a and 65b and the electrode pads 35 and 36 are electrically connected together.

The first excitation electrode is composed of a first major surface electrode (not shown) formed on both major surfaces (see the front major surface 63 and a rear major surface 64 described below) of the first leg portion 61a, and a second side surface electrode (not shown) formed on both side surfaces (see an opposed side surface 67b and the like described below) of the second leg portion 61b. The first major surface electrode and the second side surface electrode are connected together via a lead electrode (not shown).

Similarly, the second excitation electrode is composed of a second major surface electrode (not shown) formed on both major surfaces (see the front major surface 63 and the rear major surface 64 described below) of the second leg portion 61b, and a first side surface electrode (not shown) formed on both side surfaces (see an opposed side surface 67a and the like described below) of the first leg portion 61a. The second major surface electrode and the first side surface electrode are connected together via a lead electrode (not shown).

The above-described excitation electrode is a multilayer thin film composed of, for example, an underlying electrode layer made of chromium and an upper electrode layer made of gold. This thin film is formed on an entire surface using a technique, such as vacuum vapor deposition or the like, before being formed into a desired shape by metal etching using a photolithography technique. Also, the lead electrodes 65a and 65b are each a multilayer thin film composed of, for example, an underlying electrode layer made of chromium, a middle electrode layer made of gold, and an upper electrode layer made of chromium. This thin film is formed on an entire surface using a technique, such as vacuum vapor deposition or the like, before being formed into a desired shape by metal etching using a photolithography technique, and thereafter, only the upper electrode layer made of chromium is formed using a technique, such as vacuum vapor deposition or the like, while partially masking.

On the base portion 62 of the crystal resonator plate 2, as illustrated in FIG. 1(a), an electrode forming region for providing the lead electrodes 65a and 65b are provided on corner portions 66a and 66b opposite to corner portions on which the leg portions 61a and 61b are extended.

As illustrated in FIG. 1, the opposed side surfaces 67a and 67b facing each other in a width direction of the substrate 6, are formed and inclined in the same direction with respect to the front major surface 63. In this embodiment, the opposed side surfaces 67a and 67b are formed along with a Z' axis.

Also, the crystal resonator plate 2 is provided with an adhesion reinforcing portion 7 for reinforcing adhesion to the conductive adhesive 5 in side surface portions 68a and 68b of the opposed side surfaces 67a and 67b in the electrode forming region for the lead electrodes 65a and 65b.

The adhesion reinforcing portion 7 is a notch portion which is cut and formed in the opposed side surfaces 67a and 67b, and is adhered to the conductive adhesive 5 at a notch wall surface 71 of the notch portion. The notch wall surface 71 is formed, facing the front major surface 63, and is an inclined surface inclined with respect to the front major surface 63.

In the crystal resonator plate 2, the rear major surface 64 (one major surface as used herein), the notch wall surface 71 of the adhesion reinforcing portion 7, and the opposed side surfaces 67a and 67b of the substrate, constitute an adhesion surface to the conductive adhesive 5.

The adhesion reinforcing portion 7 of the crystal resonator plate 2 and the electrode pads 35 and 36 of the base 3 are adhered together by the conductive adhesive 5. Regarding the electrode adhesion of this embodiment, the notch wall surface 71 of the adhesion reinforcing portion 7, and the opposed side surfaces 67a and 67b and a base portion side surface 67c and the rear major surface 64 of the base portion 62, are adhered to the electrode pads 35 and 36 of the base 3 by the conductive adhesive 5.

Next, a test for impact resistance of the above-described crystal resonator 1 will be hereinafter described.

In the test for the impact resistance of the crystal resonator 1, it is tested whether or not the crystal resonator 1 normally operates when a physical external force is applied to the crystal resonator 1. Specifically, in the test for the impact resistance of the crystal resonator 1, the crystal resonator 1 is dropped from a previously set height, and a change amount of characteristics of the dropped crystal resonator 1 is measured. Based on the measured change amount of the characteristics, it is determined whether or not the impact resistance is satisfactory or not. Note that the housing of the crystal resonator 1 is a hexahedron, and therefore, in the test of this embodiment (hereinafter referred to as this test), the crystal resonator 1 is dropped with one of the six surfaces facing downward for each time (a total of six times). Drop operations for the six surfaces are set as one test operation.

In this test, the height is set to be 150 cm, and characteristics to be measured of the crystal resonator 1 are assumed to be a frequency and a CI value.

In this test, the crystal resonator 1 of this embodiment and a conventional crystal resonator without the adhesion reinforcing portion 7 are used to measure each characteristic (a frequency and a CI value). Note that the other parts of the conventional crystal resonator are similar to those of the crystal resonator 1 of this embodiment. Regarding the number of times of measurement, five crystal resonators 1 of this embodiment and five conventional crystal resonators are prepared, and each crystal resonator is dropped 20 times.

Figure 6:
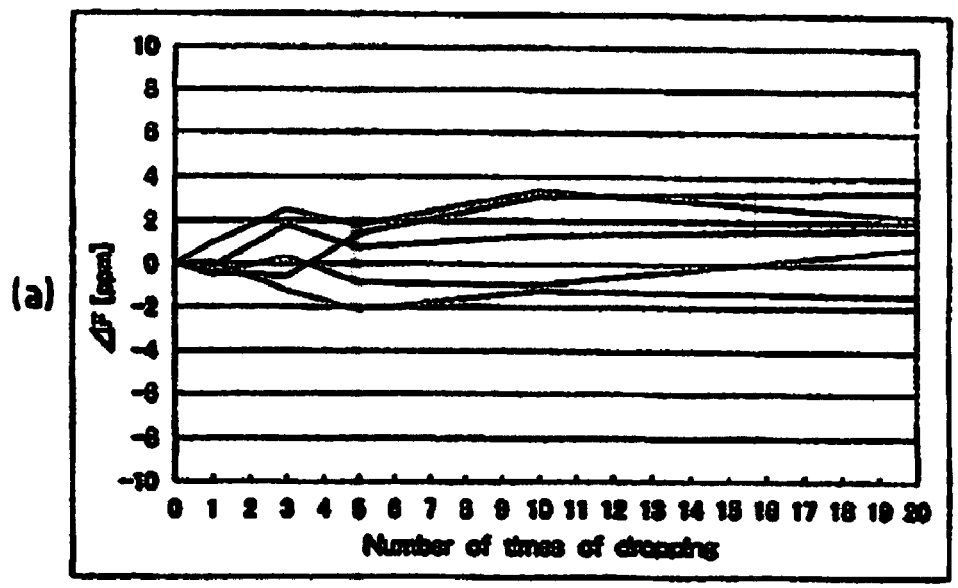
FIG. 6 Table 1(a) shows the result of measurement of a frequency of the crystal resonator 1 of this embodiment.
Figure 6:
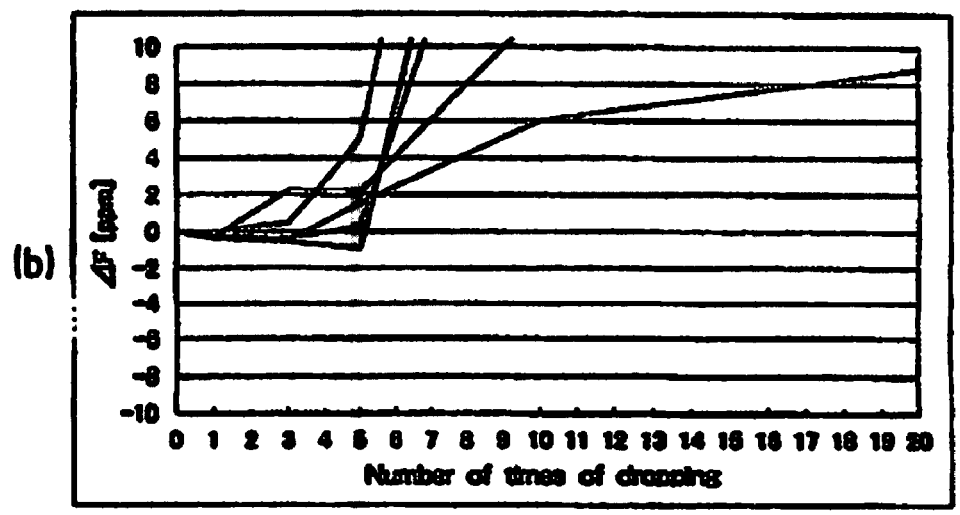
Figure 7:
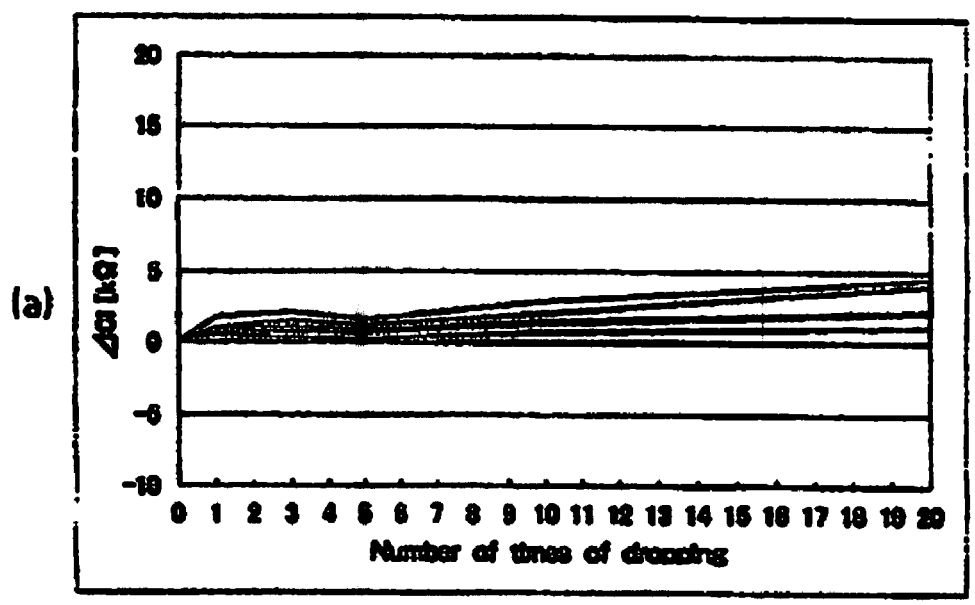
FIG. 7 Table 2(a) shows the result of measurement of a CI value of the crystal resonator 1 of this embodiment.
Figure 7:
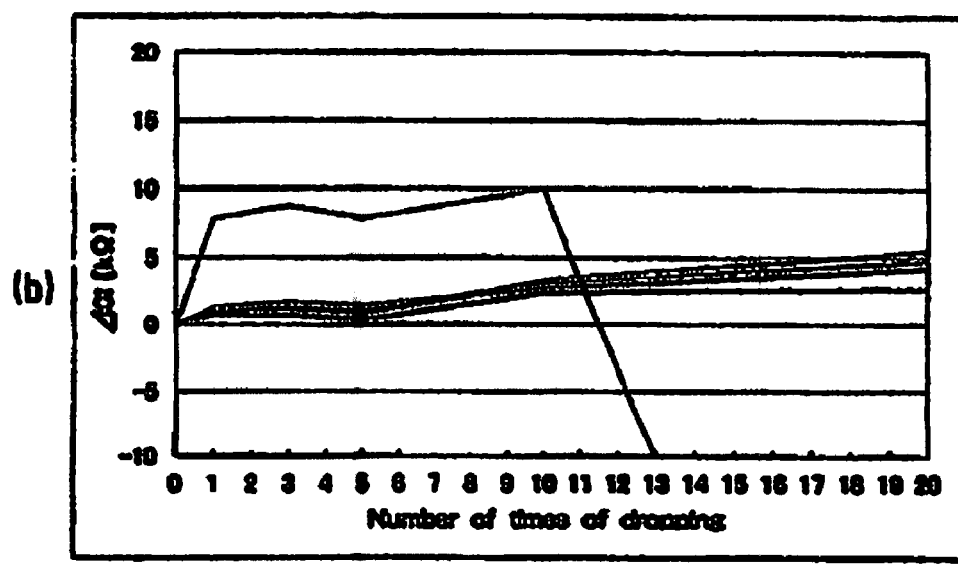

Next, the results of the measurement of this test are shown in FIGS. 6 and 7. Note that Table 1(a) in FIG. 6 shows the result of measurement of a frequency of the crystal resonator 1 of this embodiment, and Table 1(b) in FIG. 6 shows the result of measurement of a frequency of the conventional crystal resonator. Table 2(a) in FIG. 7 shows the result of measurement of a CI value of the crystal resonator 1 of this embodiment, and Table 2(b) in FIG. 7 shows the result of measurement of a CI value of the conventional crystal resonator.

Regarding the change amount of the frequency, as shown in Table 1(a) in FIG. 6, in the crystal resonator 1 of this embodiment, the change amount of the frequency is suppressed within ±5 ppm for all of the 20 drops tests.

In contract to this, as illustrated in Table 1(b) in FIG. 6, regarding the conventional crystal resonators, the frequency rapidly increase from the fifth time in all of the crystal resonators, so that the change amount of the frequency significantly exceeds the change tolerable range. In other words, in all of the conventional crystal resonators, the change amount of the frequency cannot be suppressed, and all of the conventional crystal resonators are determined as defective products in terms of impact resistance.

Regarding changes in the CI value, as shown in Table 2(a) in FIG. 7, in the crystal resonator 1 of this embodiment, the change amount of the CI value is suppressed to ±5 kΩ or less in all 20 times for all of the crystal resonators 1.

In contrast to this, as illustrated in Table 2(b) in FIG. 7, regarding the conventional crystal resonators, four of the crystal resonators do not exceed +10 kΩ which is the upper limit of the change tolerable range of the CI value in 20 times, and the change amount of the CI value of the remaining one crystal resonator reaches +10 kΩ in 20 times. In other words, it is difficult to invariably stably suppress the change amount of the CI value in all of the conventional crystal resonators. Therefore, in conventional crystal resonators, it is difficult to suppress the change amount of the CI value within a predetermined amount, and therefore, some crystal resonators are determined as defective products in terms of impact resistance.

As shown in FIGS. 6 and 7, when the crystal resonator 1 of this embodiment is compared with conventional crystal resonators, their impact resistance levels can be clearly distinguished from each other. Specifically, in this embodiment, the crystal resonator plate 2 is provided with the adhesion reinforcing portion 7, so that the crystal resonator plate 2 is not easily detached from the conductive adhesive 5 toward above the front major surface 63, as compared to conventional crystal resonators without the adhesion reinforcing portion 7. Therefore, the crystal resonator 1 of this embodiment can suppress the change amount of the CI value of the crystal resonator 1 even when a physical external force is applied to the crystal resonator 1, as compared to conventional crystal resonators.

As described above, according to the crystal resonator plate 2 of this embodiment, the substrate 6 is provided with the electrode forming region for the lead electrodes 65a and 65b; the adhesion reinforcing portion 7 is provided in the electrode forming region for the lead electrodes 65a and 65b; the front major surface 63, and the notch wall surface 71 of the adhesion reinforcing portion 7 constitute an adhesion surface to the conductive adhesive 5; and at least a portion of the notch wall surface 71 of the adhesion reinforcing portion 7 is formed and inclined with respect to the front major surface 63 so as to face the front major surface 63. Therefore, an adhesion strength when the crystal resonator plate 2 is adhered via the conductive adhesive 5 to the electrode pads 35 and 36 is increased, thereby making it possible to suppress the crystal resonator plate 2 from being detached from the conductive adhesive 5 toward above the front major surface 63 of the substrate 6. As a result, it is possible to suppress the change amounts of the frequency and the CI value (resistance value) of the crystal resonator 1 comprising the crystal resonator plate 2.

Also, the notch wall surface 71 of the adhesion reinforcing portion 7 is inclined with respect to the front major surface 63, so that by adhesion on the inclined surface to the conductive adhesive 5, the crystal resonator plate 2 can be pressed against the electrode pads 35 and 36 provided therebelow via the conductive adhesive 5.

Also, the front major surface 63, and the notch wall surface 71 of the adhesion reinforcing portion 7 constitute an adhesion surface to the conductive adhesive 5, and therefore, the conductive adhesive 5 is not provided in a gap between the crystal resonator plate 2 and the lid 4, so that the electrode short circuit of the crystal resonator 1 can be suppressed, as is different from when the conductive adhesive 5 reaches the front major surface 63 of the crystal resonator plate 2. Also, since the conductive adhesive 5 is not provided in the gap between the crystal resonator plate 2 and the lid 4, the gap between the crystal resonator plate 2 and the lid 4 can be suppressed to a minimum level, thereby making it possible to reduce a size of the crystal resonator 1.

Further, the adhesion surface to the conductive adhesive 5 includes the opposed side surfaces 67a and 67b and the base portion side surface 67c of the substrate 6. Of the opposed side surfaces 67a and 67b and the base portion side surface 67c of the substrate 6, the opposed side surfaces 67a and 67b facing each other are formed and inclined with respect to the front major surface 63 so as to face the front major surface 63. Specifically, in this embodiment, the opposed side surfaces 67a and 67b are inclined in the same direction with respect to the front major surface 63, so that the adhesion strength when the crystal resonator plate 2 is adhered via the conductive adhesive 5 to the electrode pads 35 and 36 is preferably increased, thereby making it possible to suppress the crystal resonator plate 2 from being detached from the conductive adhesive 5 toward above the front major surface 63 of the substrate 6.

Also, the adhesion reinforcing portion 7 is a notch portion, and the notch wall surface 71 of the notch portion is an adhesion surface, so that a holding force (anchor effect) can be caused to occur in adhesion of the notch wall surface 71 to the conductive adhesive 5. As a result, the adhesion strength when the crystal resonator plate 2 is adhered via the conductive adhesive 5 to the electrode pads 35 and 36 can be increased.

Also, since the substrate 6 is made of an anisotropic material, it is possible to easily incline the adhesion surfaces (the notch wall surface 71 and the opposed side surfaces 67a and 67b) with respect to the front major surface 63 and the rear major surface 64 (hereinafter referred to as both the major surfaces) along the Z'-axis direction inclined with respect to both the major surfaces 63 and 64. Also, by inclining the opposed side surfaces 67a and 67b in the same direction along the Z'-axis direction inclined with respect to both the major surfaces 63 and 64, it is possible to easily incline the opposed side surfaces 67a and 67b in the same direction with respect to both the major surfaces 63 and 64.

Also, this embodiment is not limited to the form of FIG. 1(*b*). As illustrated in FIG. 1(*c*), an extended electrode portion 8 obtained by extending the lead electrodes 65a and 65b may be formed on the adhesion surface of the adhesion reinforcing portion 7. As illustrated in FIG. 1(*c*), the extended electrode portion 8 is extended from the lead electrodes 65a and 65b and is provided on the notch wall surface 71 of the notch portion.

The extended electrode portion 8 is formed along with the lead electrodes 65a and 65b in the step of forming the lead electrodes 65a and 65b. Specifically, a metal thin film is formed on an entire surface of a crystal wafer K (see FIG. 2) in which an outer shape of the substrate 6 has been formed, using vacuum vapor deposition or sputtering, and next, the metal thin film which is not required to form an electrode is removed by metal etching, thereby forming the lead electrodes 65a and 65b, the extended electrode portion 8, the excitation electrode, and the like. Hereinafter, a method for forming the extended electrode portion 8 by vacuum vapor deposition will be described.

Initially, the crystal wafer K whose outer shape has been formed by etching is housed into a mask jig (not shown).

Figure 2:
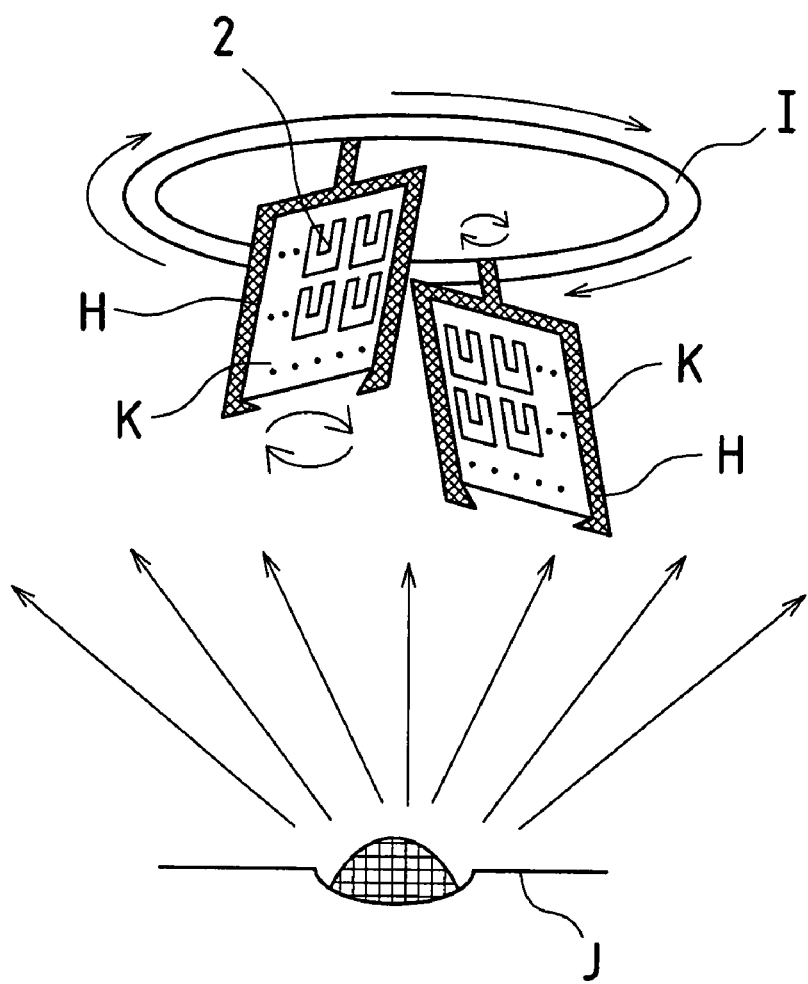
FIG. 2 is a schematic diagram of a vapor deposition apparatus for forming a metal thin film.

Next, as illustrated in FIG. 2, the mask jig is fixed to a work holder H of a vapor deposition apparatus. A plurality of the work holders H are attached around a turn table I which is located at a predetermined distance from a deposition source J and is horizontally turned. Also, each work holder H is attached to the turn table I in a manner which allows the work holder H to rotate on its axis. Each work holder H has an elevation angle of 45 degrees with respect to the turn table I, and also, the rotation axis of the work holder H is positioned and inclined at 45 degrees from a state of the work holder H facing the horizontal plane. When fixed to the work holder H, the mask jig is disposed in a manner which allows the base portion 62 of the crystal resonator plate 2 formed on the crystal wafer K to face in a direction toward the deposition source J.

The work holder H is revolved around an axis passing through the deposition source J as a center axis as the turn table I is rotated. Also, for example, the work holder H is rotated by 90 degrees and is positioned every time the turn table I is rotated by 120 degrees. An electrode material (e.g., chromium or gold) evaporated from the deposition source J is supplied to the crystal wafer K. With such an arrangement, a metal thin film can be formed on both the major surfaces (see the front major surface 63 and the rear major surface 64), the opposed side surfaces 67a and 67b, the notch wall surface 71, and the like of the substrate 6.

Also, by changing the elevation angle of the work holder H with respect to the turn table I or the inclination angle of the work holder H with respect to the rotation axis, a range within which the electrode material evaporated from the deposition source J is directly projected is changed (a shade portion in which the electrode material is not directly projected is changed) in a portion, such as the notch wall surface 71 or the like. Therefore, by changing the elevation angle or the inclination angle, a range of the metal thin film which is formed on the notch wall surface 71 can be controlled.

Next, a resist is applied to the entire substrate 6, and development is performed so that the resist remains on a portion which is to remain as the lead electrodes 65a and 65b and a portion which is to remain as the extended electrode portion 8. Further, the thin film of a portion other than the portions on which the resist remains is removed by metal etching before removing the resist, thereby forming the lead electrodes 65a and 65b and the extended electrode portion 8.

Next, a method for forming the extended electrode portion 8 by sputtering will be described. Initially, the crystal wafer K whose outer shape has been formed by etching is housed into the mask jig (not shown).

Next, the mask jig is fixed to the work holder. A plurality of the work holders are disposed at substantially the same distance from a target facing each other, and substantially parallel to each other, followed by sputtering. A metal thin film is formed on one surface of the crystal wafer K, and thereafter, the work holder is turned upside down, and a metal thin film is formed on the other surface.

According to sputtering, the electrode material scattered from a target can go around the substrate significantly, and therefore, even when the substrate is not inclined, a metal thin film is formed on the opposed side surfaces 67a and 67b and the like. With such an arrangement, a metal thin film is formed on both the major surfaces (see the front major surface 63 and the rear major surface 64), the opposed side surfaces 67a and 67b, the notch wall surface 71, and the like of the substrate 6.

Next, a resist is applied on the entire substrate 6, and development is performed so that the resist remains on a portion which is to remain as the lead electrodes 65a and 65b and a portion which is to remain as the extended electrode portion 8. Further, the thin film of a portion other than the portions on which the resist remains is removed by metal etching before removing the resist, thereby forming the lead electrodes 65a and 65b and the extended electrode portion 8.

As described above, according to the crystal resonator plate 2 having such a structure, since the extended electrode portion 8 is formed on the adhesion surface, the area of electrical contact with the conductive adhesive 5 is increased, thereby making it possible to reduce the electrical resistance.

Also, the extended electrode portion 8 may be formed on the entire notch wall surface 71. In this case, the area of electrical contact with the conductive adhesive 5 is further increased, thereby making it possible to further reduce the electrical resistance.

Also, the extended electrode portion 8 may be formed on a portion of the notch wall surface 71. In this case, since the extended electrode portion 8 is formed on a portion of the adhesion surface, the area of electrical contact with the conductive adhesive 5 is increased, thereby making it possible to reduce the electrical resistance. In addition, since the adhesion area of the conductive adhesive 5 and the crystal resonator plate 2 is secured, the adhesion strength can be held.

Also, as described above, according to the crystal resonator 1 of this embodiment, the base 3 and the lid 4 are adhered together to form a housing whose inner portion is hermetically enclosed; the electrode pads 35 and 36 are provided on the base 3 of the housing inner portion 11; and the adhesion surface of the crystal resonator plate 2 is adhered onto the electrode pads 35 and 36 via the conductive adhesive 5. Therefore, the adhesion strength of the crystal resonator plate 2 to the base 3 via the conductive adhesive 5 can be increased, thereby making it possible to suppress the crystal resonator plate 2 from being detached from the conductive adhesive 5 toward above the front major surface 63 of the substrate 6. In other words, regarding the impact resistance of the crystal resonator 1 with respect the six directions, it is possible to suppress the crystal resonator plate 2 whose inner portion is hermetically enclosed from being detached from the conductive adhesive 5 with respect to the six directions of the crystal resonator 1. As a result, it is possible to suppress the change amounts of the frequency and the CI value (resistance value) of the crystal resonator 1.

Also, the substrate 6 of the crystal resonator plate 2 is formed of a crystal piece, and the lead electrodes 65a and 65b of the crystal resonator plate 2 are formed of a multilayer film having a lowermost layer made of chromium. Therefore, the high adhesiveness of the crystal piece and chromium makes it easy to form the lead electrodes 65a and 65b on the substrate 6.

Also, the material for the conductive adhesive 5 includes silicone, and the lead electrodes 65a and 65b of the crystal resonator plate 2 are formed of a multilayer film having an uppermost layer made of chromium. Therefore, the high adhesiveness of silicone and chromium makes it easy to adhere the conductive adhesive 5 and the lead electrodes 65a and 65b together.

Although the tuning fork crystal resonator 1 is applied as a piezoelectric resonator device in this embodiment, the present invention is not limited to this. An oscillator which performs piezoelectric sliding vibration or a SAW device may also be applicable. Also, the axial direction is not limited to that described in the figures, and an axis can be set, depending on the substrate of the piezoelectric resonator device. Also, as in the tuning fork crystal resonator 1 of this embodiment, a cantilever type piezoelectric resonator device preferably exhibits the operational effect of the crystal resonator 1 of this embodiment.

Also, although a crystal piece is used as the substrate 6 in this embodiment, the present invention is not limited to this. Any anisotropic material of single crystal may be used, and other materials may also be used. Other examples of the material for the substrate include single crystal materials, such as lithium tantalate ($LiTaO_3$), lithium niobate ($LiNbO_3$), and the like.

Also, although the conductive adhesive 5 is made of silicone containing a plurality of silver fillers in this embodiment, the present invention is not limited to this.

Also, although the excitation electrode is formed of chromium and gold in this order in this embodiment, the excitation electrode may be formed of, for example, in order of chromium and silver, in order of chromium, gold and chromium, or in order of chromium, silver and chromium. In other words, preferably, the substrate 6 is formed of a crystal piece, and the excitation electrode is formed of a multilayer structure whose lowermost layer is made of chromium. In this case, the adhesiveness of the crystal piece and chromium is high, so that the lead electrodes 65a and 65b are easily formed on the substrate 6. Also, the excitation electrode may be formed of three or more layers (multilayer structure).

Also, in this embodiment, the lead electrodes 65a and 65b are formed of chromium, gold and chromium in this order, or alternatively, for example, may be formed of chromium, silver and chromium in this order. Specifically, preferably, the material for the conductive adhesive 5 includes silicone, and the lead electrodes 65a and 65b of the crystal resonator plate 2 is formed of a multilayer structure whose uppermost layer is made of chromium. In this case, the adhesiveness of silicone and chromium is high, so that the conductive adhesive 5 and the lead electrodes 65a and 65b are easily adhered together. Also, the lead electrodes 65a and 65b may be formed of four or more layers (multilayer structure).

Also, although the adhesion reinforcing portion 7 is provided in the opposed side surfaces 67a and 67b in this embodiment, the present invention is not limited to this. The adhesion reinforcing portion 7 may be provided only in either of the opposed side surfaces 67a and 67b.

Also, although the opposed side surfaces 67a and 67b facing each other in the width direction of the substrate 6 are formed and inclined in the same direction along the Z'-axis direction in this embodiment, the present invention is not limited to this. Opposed side surfaces facing each other in a longitudinal direction of the substrate 6 may be formed and inclined in the same direction with respect to the front major surface 63. Also, all the side surfaces may be formed and inclined. In this case, the two pairs of opposed side surfaces are each inclined in the same direction with respect to the front major surface 63, and adhesion strength is increased at each opposed side surface, so that adhesion strength of the whole crystal resonator plate 2 to the conductive adhesive 5 can be increased.

Also, although the opposed side surfaces 67a and 67b of the substrate 6 are formed and inclined in the same direction with respect to the front major surface 63 in this embodiment, the present invention is not limited to this. The opposed side surfaces 67a and 67b of the substrate 6 may be inclined in any direction as long as the opposed side surfaces 67a and 67b are formed and inclined with respect to the front major surface 63 to face the front major surface 63.

Also, although the adhesion surface to the conductive adhesive 5 is formed, facing the front major surface 63 in this embodiment, the present invention is not limited to this. At least a portion of the adhesion surface to the conductive adhesive 5 may be formed, facing the front major surface 63. In other words, surfaces other than the adhesion surface to the conductive adhesive 5 of the adhesion reinforcing portion 7 may be formed, facing in directions other than toward the front major surface 63.

Also, although the adhesion reinforcing portion 7 of the crystal resonator plate 2 and the base 3 are adhered together by the conductive adhesive 5 in this embodiment, the present invention is not limited to this. At least the adhesion reinforcing portion 7 of the crystal resonator plate 2 and the base 3 may be adhered together by the conductive adhesive 5. Specifically, the adhesion reinforcing portion 7 and the base 3 may be adhered together by the conductive adhesive 5, and other portions of the crystal resonator plate 2 may be adhered to the base 3. Note that, at the other portions, only adhesion of the crystal resonator plate 2 to the base 3 may be performed, and continuity does not have to be established between the excitation electrode of the crystal resonator plate 2 and the electrode pad of the base 3 by the conductive adhesive 5.

Also, the shape of the crystal resonator plate 2 of this embodiment is not limited to the shape of the crystal resonator plate 2 of FIG. 1. For example, as illustrated in FIG. 3, a rectangular groove portion 69 may be formed in each of the leg portions 61a and 61b.

Figure 3:
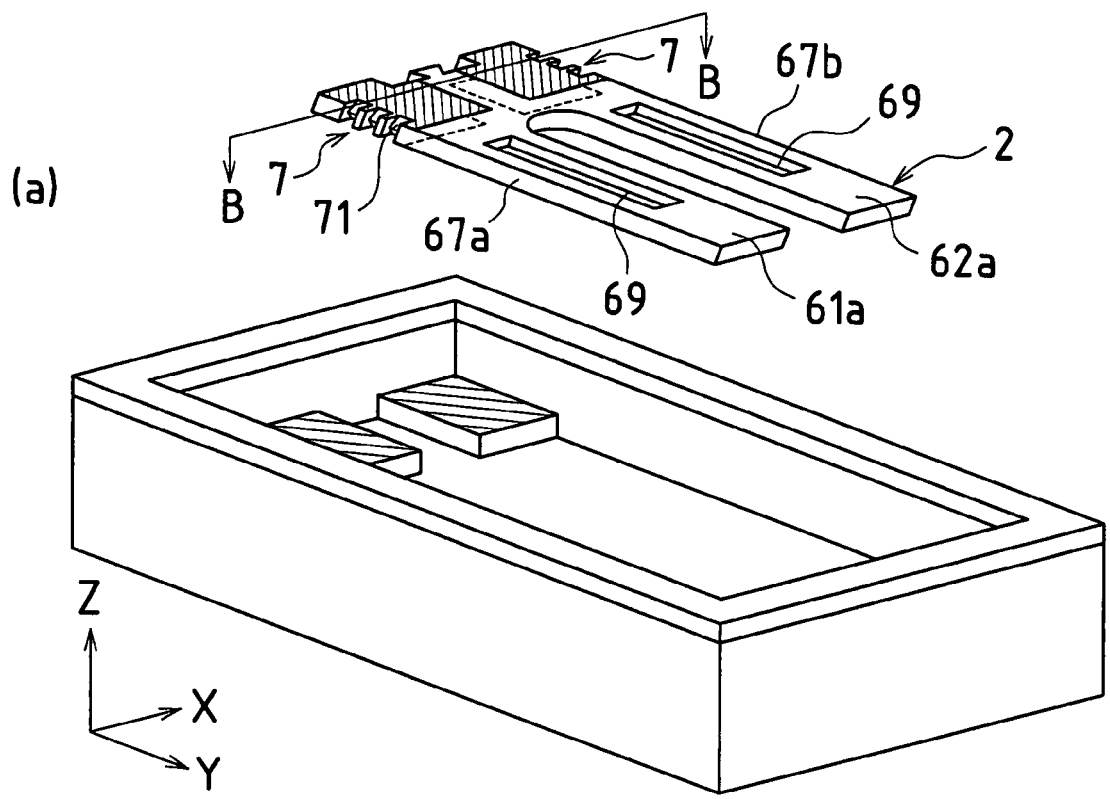
FIG. 3(a) is a schematic exploded perspective view of a base and a crystal resonator plate constituting a crystal resonator according to another embodiment.
FIG. 3(b) is a schematic cross-sectional view of the crystal resonator, taken along line B-B of FIG. 3(a) in the direction of the arrow.
Figure 3:
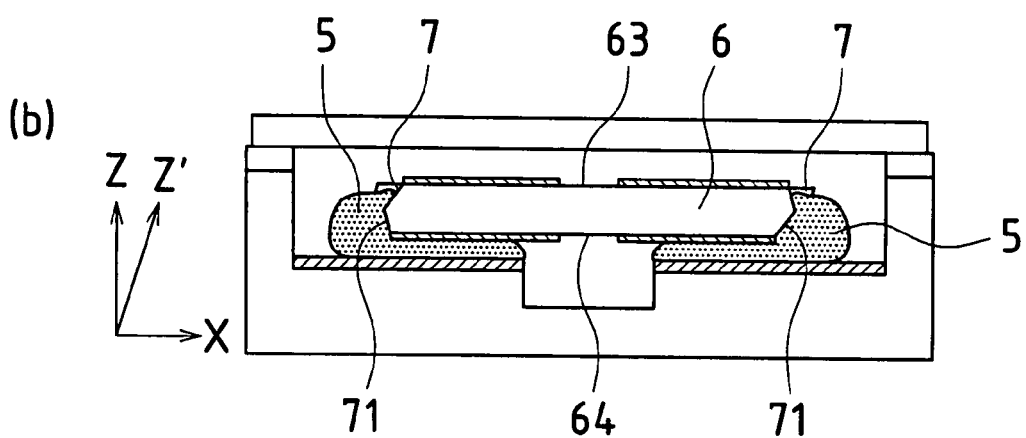

The crystal resonator plate 2 of FIG. 3 is further different from the crystal resonator plate 2 of FIG. 1 in the shape of the adhesion reinforcing portion 7. The adhesion reinforcing portion 7 of FIG. 3 is a notch portion which is cut and formed. A notch wall surface 71 of the notch portion has a protrusion in the width direction of the substrate at substantially the middle in a thickness direction of the substrate 6. Therefore, the notch wall surface 71 has an angle larger than that of the Z' axis with respect to both the major surfaces 63 and 64 as is different from the opposed side surfaces 67a and 67b. Note that, in the crystal resonator plate 2 of FIG. 3, the notch wall surface 71 is formed as an adhesion surface of the adhesion reinforcing portion 7.

Also, the adhesion reinforcing portion 7 of FIG. 3 is formed by arbitrarily changing an etching rate which is used to form the adhesion reinforcing portion 7 of FIG. 1. Alternatively, the adhesion reinforcing portion 7 of FIG. 3 is formed by changing an etching amount with respect to each part of the substrate 6 by using a mask. Further, the adhesion reinforcing portion 7 is formed by half etching, i.e., is etched from the front major surface 63 and is then etched from the rear major surface 64.

Note that the adhesion reinforcing portion 7 is not limited to that which is formed by half etching, and the adhesion reinforcing portion 7 may be formed by etching from only either of both the major surfaces 63 and 64.

Figure 4:
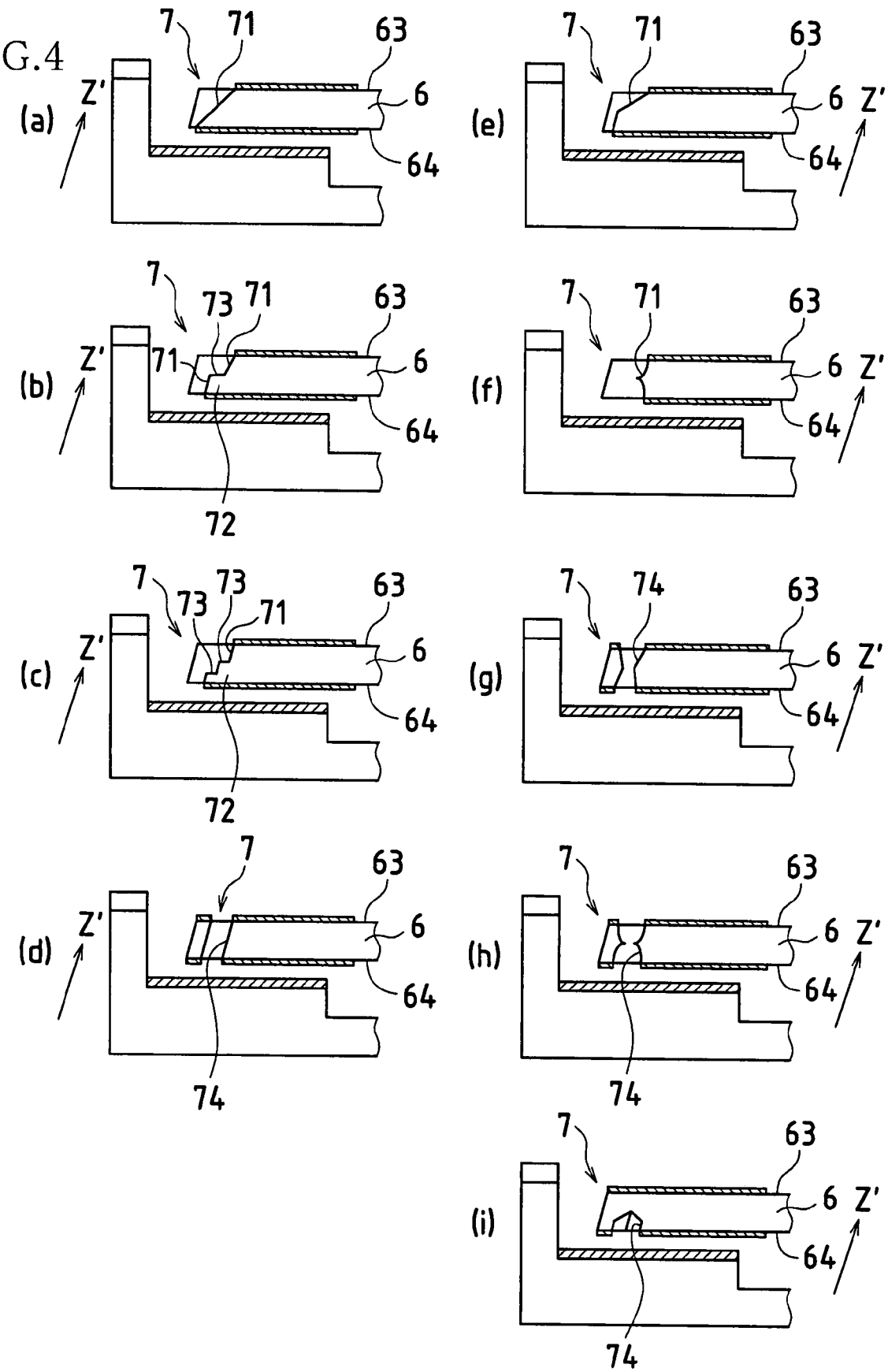
FIGS. 4(a) to 4(i) are schematic enlarged cross-sectional views of variations of an adhesion reinforcing portion provided in the crystal resonator plate of this embodiment.

Also, as long as the adhesion reinforcing portion 7 is formed so that at least a portion of the adhesion surface to the conductive adhesive 5 faces the front major surface 63, the adhesion reinforcing portion 7 is not limited to the shapes of FIGS. 1 and 3. For example, the adhesion reinforcing portion 7 may be that which is illustrated in FIG. 4. The adhesion reinforcing portion 7 of FIG. 4 is formed by an etching step similar to that which is used to form the adhesion reinforcing portion 7 of FIG. 3.

The adhesion reinforcing portion 7 of FIG. 4(a) is a notch portion which is cut and formed, and a notch wall surface 71 of the notch portion is provided as an adhesion surface of the adhesion reinforcing portion 7. The notch wall surface 71 is formed and inclined with respect to the front major surface 63 more than the Z' axis, and with respect to the rear major surface 64 more than the Z' axis.

The adhesion reinforcing portion 7 of FIG. 4(b) is a notch portion which is cut and formed, and a notch wall surface 71 of the notch portion is provided as an adhesion surface of the adhesion reinforcing portion 7. Also, the adhesion reinforcing portion 7 has a step portion 72, and the notch wall surface 71 above the step portion 72 is formed and inclined with respect to the front major surface 63 more than the Z' axis. Also, the notch wall surface 71 below the step portion 72 is formed in the same direction as that of the Z' axis. Also, the step portion 72 has a top surface 73 which is formed and inclined downward from the front major surface 63 side to the rear major surface 64 side.

The adhesion reinforcing portion 7 of FIG. 4(c) is a notch portion which is cut and formed, and a notch wall surface 71 of the notch portion is formed as an adhesion surface of the adhesion reinforcing portion 7. Also, in the adhesion reinforcing portion 7, the adhesion surface has two step portions 72, and the notch wall surface 71 is formed in the same direction as that of the Z' axis. Also, the two step portions 72 has top surfaces 73 which are formed in the same direction as that of both the major surfaces 63 and 64.

The adhesion reinforcing portion 7 of FIG. 4(*d*) is a through hole which is formed, penetrating between both the major surfaces 63 and 64 of the substrate 6. A through wall surface 74 of the through hole is formed as an adhesion surface. Also, a through angle forming the through hole has the same direction as the Z'-axis direction.

The adhesion reinforcing portion 7 of FIG. 4(*e*) is a notch portion which is cut and formed, and a notch wall surface 71 of the notch portion is formed as an adhesion surface. In the notch wall surface 71 of the notch portion, the notch wall surface 71 above substantially the middle in the thickness direction of the substrate 6 as a boundary, is inclined with respect to the front major surface 63 more than the Z' axis, and the notch wall surface 71 below the boundary is formed in the same direction as that of the Z' axis.

The adhesion reinforcing portion 7 of FIG. 4(*f*) is a notch portion which is cut and formed, and a notch wall surface 71 of the notch portion is formed as an adhesion surface. The notch wall surface 71 of the notch portion has a curved surface. As illustrated in FIG. 4(*f*), a middle portion in the thickness direction of the substrate 6 has a curved protrusion.

The adhesion reinforcing portion 7 of FIG. 4(*g*) is a through hole which is formed, penetrating between both the major surfaces 63 and 64 of the substrate 6, and a through wall surface 74 of the through hole is formed as an adhesion surface. The through wall surface 74 of the adhesion reinforcing portion 7 of FIG. 4(*g*) has a minimum diameter at substantially the middle portion in the thickness direction of the substrate 6, and the side surface 74 is gradually broadened such that the maximum diameter is at the opening ends located on both the major surfaces 63 and 64 of the through hole.

The adhesion reinforcing portion 7 of FIG. 4(*h*) is a through hole which is formed, penetrating between both the major surfaces 63 and 64 of the substrate 6, and a through wall surface 74 of the through hole is formed as an adhesion surface. The through wall surface 74 of the through hole has curved surfaces, and as illustrated in FIG. 4(*h*), a middle portion in the thickness direction of the substrate 6 has a curved protrusion so that the through hole has a minimum diameter at the middle portion.

The adhesion reinforcing portion 7 of FIG. 4(*i*) is a hole with a base surface which is formed on the major surface 64 of the substrate 6, and a wall surface 74 of the hole with the base surface is formed as an adhesion surface. The wall surface 74 of the hole with the base surface is formed into a polyhedron whose vertex portion is in the shape of a polygonal pyramid, and as illustrated in FIG. 4(*i*), has a cross-section in the shape of substantially a pentagon.

As described above, in the adhesion reinforcing portions 7 of FIGS. 3, 4(*a*), 4(*b*) and 4(*e*) to 4(*h*), the adhesion surface is formed and inclined with respect to both the major surfaces 63 and 64 more than the Z'-axis direction. Therefore, the adhesion strength to the conductive adhesive 5 can be further increased than that of the adhesion reinforcing portion 7 of FIG. 1.

As described above, the adhesion reinforcing portions 7 of FIGS. 4(*d*), 4(*g*) and 4(*h*) are through holes which are formed, penetrating between both the major surfaces 63 and 64 of the substrate 6, and the through wall surfaces 74 of the through holes are formed as adhesion surfaces. Therefore, a holding force (anchor effect) can be caused to occur in adhesion of the conductive adhesive 5 to the through wall surface 74 of the through hole. As a result, the adhesion strength when the crystal resonator plate 2 is adhered via the conductive adhesive 5 to the electrode pads 35 and 36 can be increased.

Also, the adhesion reinforcing portions 7 of FIGS. 4(*b*) and 4(*c*) have the step portion 72, and the step portion 72 is included in the adhesion surface. Therefore, the adhesion to the conductive adhesive 5 on the top surface 73 of the step portion 72 makes it possible to press the crystal resonator plate 2 against the electrode pads 35 and 36 provided below the crystal resonator plate 2 via the conductive adhesive 5.

Also, the adhesion reinforcing portion 7 of FIG. 4(*i*) is a hole with a base surface which is formed in the major surface 64 of the substrate 6, and the wall surface 74 of the hole with the base surface is formed as an adhesion surface. Therefore, a holding force (anchor effect) can be caused to occur in adhesion of the conductive adhesive 5 to the wall surface 74 of the hole with the base surface. As a result, the adhesion strength when the crystal resonator plate 2 is adhered via the conductive adhesive 5 to the electrode pads 35 and 36 can be increased.

Also, the adhesion reinforcing portions 7 of FIGS. 3 and 4(*a*) to 4(*i*) have an operational effect similar to that of the adhesion reinforcing portion 7 of FIG. 1.

Note that, as in the crystal resonator plate 2 of FIG. 1(*c*), an extended electrode portion 8 extended from the lead electrodes 65*a* and 65*b* may be provided on the adhesion surfaces of the adhesion reinforcing portions 7 of FIGS. 4(*a*) to 4(*i*). Thereby, the area of electrical contact with the conductive adhesive 5 is increased, thereby making it possible to reduce the electrical resistance.

Next, another embodiment will be described with reference to the drawings. Note that the following embodiment indicates a tuning fork crystal resonator (hereinafter referred to as a crystal resonator) to which the piezoelectric resonator device of the present invention is applied as in the above-described embodiment.

Figure 5:
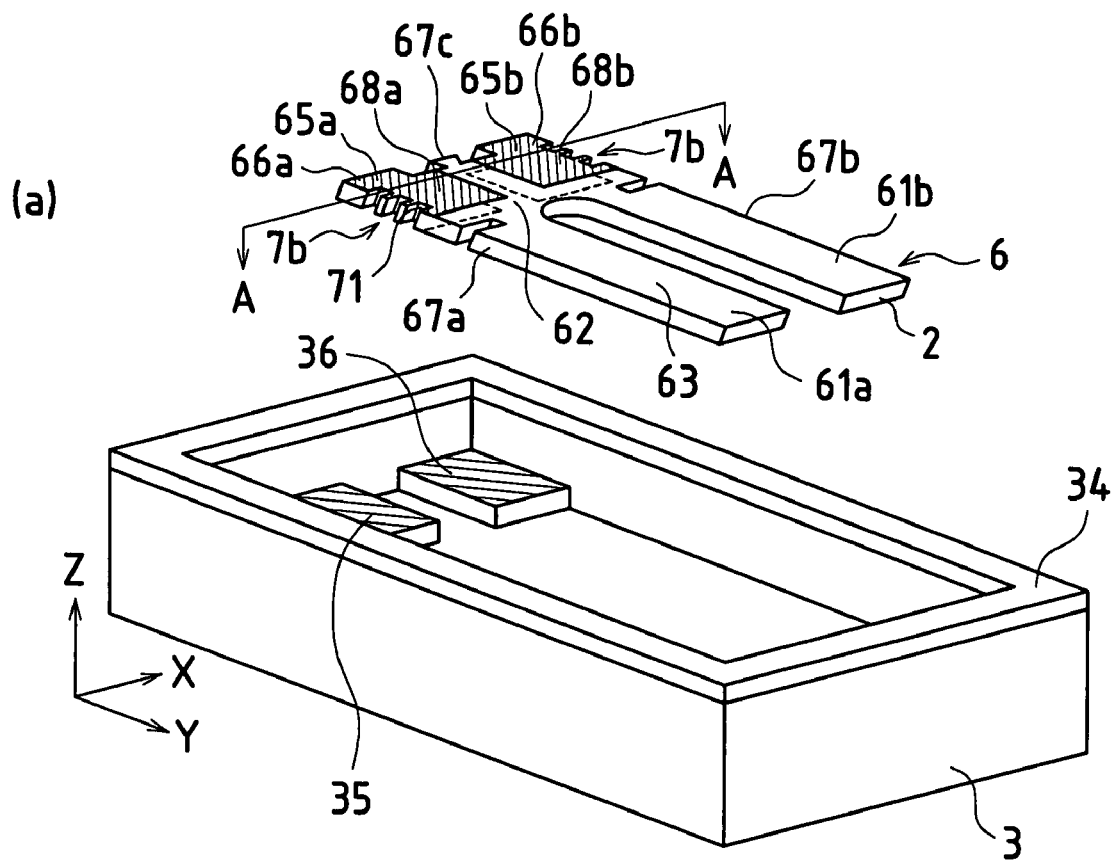
FIG. 5(a) is a schematic exploded perspective view of a base and a crystal resonator plate constituting a crystal resonator according to this embodiment.
FIG. 5(b) is a schematic cross-sectional view of the crystal resonator, taken along line A-A of FIG. 1(a) in the direction of the arrow.
Figure 5:
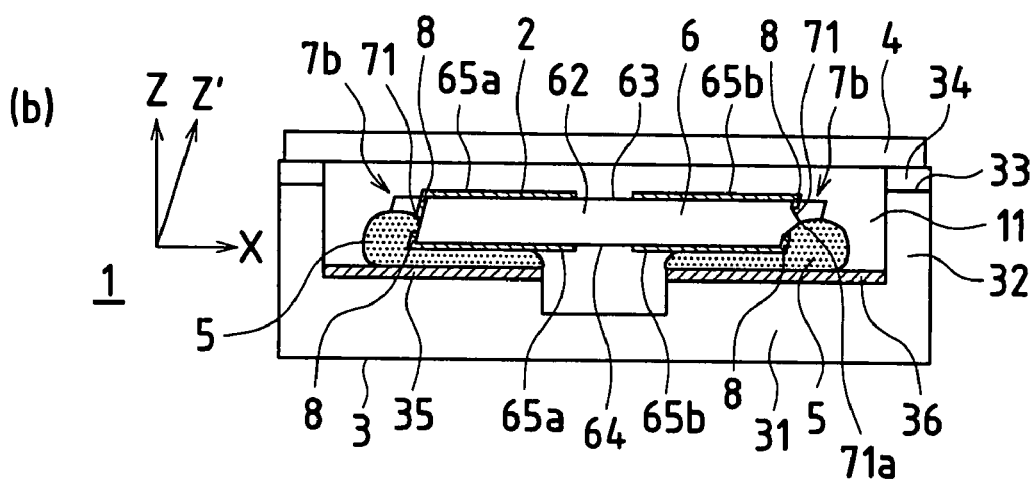

As illustrated in FIG. 5, the crystal resonator 1 of this embodiment comprises a crystal resonator plate 2 (a piezoelectric resonator plate as used herein), a base 3 for holding the crystal resonator plate 2, and a lid 4 for hermetically enclosing the crystal resonator plate 2 held by the base 3. Parts other than the crystal resonator plate 2 are similar to those of the above-described embodiment and will not be described.

As illustrated in FIG. 5, the crystal resonator plate 2 is formed by etching a substrate 6 which is a crystal piece made of an anisotropic material. The substrate 6 is composed of two leg portions 61*a* and 61*b* (a first leg portion and a second leg portion), and a base portion 62. The two leg portions 61*a* and 61*b* are extended from the base portion 62.

Also, in the two leg portions 61*a* and 61*b*, as illustrated in FIG. 5, a protrusion 71*a* is formed on an opposed side surface 67*b* of the substrate 6. The protrusion 71*a* is formed by etching both sides of the substrate 6 when the substrate 6 is formed. Specifically, the substrate 6 is etched so that the substrate 6 is penetrated. In this case, one side surface of the through portion is etched into one plane, and the other side surface opposed thereto is etched into a protrusion having two planes. Therefore, by further etching, the protrusion portion having two planes is made smaller, thereby forming the protrusion 71*a*.

Note that the substrate 6 may be further etched so that the opposed side surfaces 67*a* and 67*b* facing each other in the width direction of the substrate 6 are formed into planes which are inclined in the same direction with respect to the front major surface 63, as in the above-described embodiment (see FIG. 1).

On a front major surface 63 (the other major surface as used herein) of the crystal resonator plate 2, two excitation electrodes (a first excitation electrode and a second excitation electrode (not shown)) having different potentials, and lead electrodes 65a and 65b which are led from the excitation electrodes so as to electrically connect these excitation electrodes to electrode pads 35 and 36 (external electrodes as used herein), are provided. The lead electrodes 65a and 65b and the electrode pads 35 and 36 are adhered together via a conductive adhesive 5, so that the lead electrodes 65a and 65b and the electrode pads 35 and 36 are electrically connected together.

The structures of the first excitation electrode and the second excitation electrode are similar to those of the above-described embodiment and will not be described.

On the base portion 62 of the crystal resonator plate 2, as illustrated in FIG. 5(a), an electrode forming region for providing the lead electrodes 65a and 65b is provided on corner portions 66a and 66b opposite to corner portions on which the leg portions 61a and 61b are extended.

Also, the crystal resonator plate 2 is provided with an adhesion reinforcing electrode portion 7b for reinforcing adhesion to the conductive adhesive 5 and electrically connecting to the lead electrodes 65a and 65b in side surface portions 68a and 68b of the opposed side surfaces 67a and 67b in the electrode forming region for the lead electrodes 65a and 65b.

The adhesion reinforcing electrode portion 7b is a notch portion which is cut and formed in the opposed side surfaces 67a and 67b, and is adhered to the conductive adhesive 5 on a notch wall surface 71 of the notch portion. The notch wall surface 71 is formed, protruding at substantially an equal distance from both the major surfaces 63 and 64.

Note that the adhesion reinforcing electrode portion 7b may be a protruding portion (not shown) which is formed and protruded from the opposed side surfaces 67a and 67b of the electrode forming regions, and may be adhered to the conductive adhesive 5 on a protruding wall surface of the protruding portion. Specifically, the protruding portion is provided by extending a portion of the crystal resonator plate 2, and has substantially a rectangular shape, for example.

Also, the adhesion reinforcing electrode portion 7b is provided with an extended electrode portion 8 which is formed and extended from the lead electrodes 65a and 65b. The extended electrode portion 8 may be formed on the entire notch wall surface, or may be formed on a portion of the notch wall surface 71. As is similar to the above-described method, the extended electrode portion 8 is formed by forming a metal thin film on the crystal wafer K by vacuum vapor deposition or sputtering, and thereafter, subjecting a portion unnecessary for the formation of the electrode to metal etching.

In this crystal resonator plate 2, a rear major surface 64 (one major surface as used herein), the notch wall surface 71 of the adhesion reinforcing electrode portion 7b, and the opposed side surfaces 67a and 67b of the substrate constitute an adhesion surface to the conductive adhesive 5.

The adhesion reinforcing electrode portion 7b of the crystal resonator plate 2 and the electrode pads 35 and 36 of the base 3 are adhered together by the conductive adhesive 5. Also, regarding the adhesion of the electrode of this embodiment, the notch wall surface 71 of the adhesion reinforcing electrode portion 7b, the opposed side surfaces 67a and 67b and the base portion side surface 67c and the rear major surface 64 of the base portion 62, and the electrode pads 35 and 36 of the base 3, are adhered together by the conductive adhesive 5.

As described above, according to the crystal resonator plate 2 of this embodiment, the electrode forming region for the lead electrodes 65a and 65b is provided on the substrate 6; the adhesion reinforcing electrode portion 7b is provided in the electrode forming region for the lead electrodes 65a and 65b; and the rear major surface 64 and the adhesion reinforcing electrode portion 7b constitute an adhesion surface to the conductive adhesive 5. Therefore, the area of adhesion is increased, so that the adhesion strength when the crystal resonator plate 2 is adhered via the conductive adhesive 5 to an external electrode is increased, thereby making it possible to suppress the crystal resonator plate 2 from being detached from the conductive adhesive 5. As a result, it is possible to suppress change amounts of the frequency and the CI value (resistance value) of the crystal resonator 1 provided with the crystal resonator plate 2.

Also, since the rear major surface 64 and the adhesion reinforcing electrode portion 7b constitute an adhesion surface to the conductive adhesive 5, the conductive adhesive 5 is not provided in a gap between the crystal resonator plate 2 and the lid 4, so that the electrode short circuit of the crystal resonator 1 can be suppressed, as is different from when the conductive adhesive 5 reaches the front major surface 63 of the crystal resonator plate 2. Also, since the conductive adhesive 5 is not provided in the gap between the crystal resonator plate 2 and the lid 4, the gap between the crystal resonator plate 2 and the lid 4 can be suppressed to a minimum level, thereby making it possible to reduce a size of the crystal resonator 1.

Also, since the extended electrode portion 8 is provided in the adhesion reinforcing electrode portion 7b, the area of electrical contact with the conductive adhesive 5 can be increased, thereby making it possible to reduce the electrical resistance. In other words, by forming the extended electrode portion 8, the area of electrical contact with the conductive adhesive 5 is increased, thereby making it possible to reduce the electrical resistance. In addition, since the area of adhesion of the conductive adhesive 5 and the crystal resonator plate 2 is secured, it becomes possible to hold the adhesion strength.

Note that the shape of the crystal resonator plate 2 of this embodiment is not limited to the shape of the crystal resonator plate 2 of FIG. 1. For example, as illustrated in FIG. 3, a rectangular groove portion 69 may be formed in each of the leg portions 61a and 61b. With such a structure, an electric field component formed by power applied by the excitation electrode can be effectively utilized, thereby making it possible to reduce a size of the crystal resonator plate 2.

Also, a notch portion, a through hole, or a hole with a base surface, etc. may be formed as illustrated in FIG. 4, and the extended electrode portion 8 may be provided on a wall surface to serve as the adhesion reinforcing electrode portion 7b. Also, a protruding portion protruding from the opposed side surfaces 67a and 67b may be provided as the adhesion reinforcing electrode portion 7b.

With such a structure, the crystal resonator plate 2 is pressed against the plane electrode pads 35 and 36 by the conductive adhesive 5, or a holding force (anchor effect) can be caused to occur in adhesion of the notch wall surface 71, the through hole wall surface 71, or the like, and the conductive adhesive 5. As a result, the adhesion strength when the crystal resonator plate 2 is adhered via the conductive adhesive 5 to the electrode pads 35 and 36 can be increased. Also, since the extended electrode portion 8 is provided in the adhesion reinforcing electrode portion 7b, the area of electrical contact with the conductive adhesive 5 can be increased, thereby making it possible to reduce the electrical resistance.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

INDUSTRIAL APPLICABILITY

In the present invention, particularly, a single-crystal anisotropic material is useful as a substrate for a piezoelectric resonator plate.

The invention claimed is:

1. A piezoelectric resonator plate in which excitation electrodes having different potentials and lead electrodes connected to the excitation electrodes so as to electrically connect the excitation electrodes to external electrodes are provided on a substrate having first and second major surfaces, and the lead electrodes are connected via a conductive adhesive to the external electrodes, wherein
    an electrode forming region for providing the lead electrodes is set on the substrate,
    an adhesion reinforcing portion for reinforcing adhesion to the conductive adhesive is provided in at least one of opposed side surfaces of the substrate in the electrode forming region for the lead electrodes, and the adhesion reinforcing portion is a notch portion which is cut and formed in at least one of the opposed side surfaces of the substrate,
    the first major surface of the substrate and a notch wall surface of the notch portion constitute an adhesion surface to the conductive adhesive, and
    at least a portion of the wall surface of the notch portion is inclined toward the plane of the second major surface.

2. A piezoelectric resonator plate in which excitation electrodes having different potentials and lead electrodes connected to the excitation electrodes so as to electrically connect the excitation electrodes to external electrodes are provided on a substrate having first and second major surfaces, and the lead electrodes are connected via a conductive adhesive to the external electrodes, wherein
    an electrode forming region for providing the lead electrodes is set on the substrate,
    an adhesion reinforcing portion for reinforcing adhesion to the conductive adhesive is provided in the electrode forming region for the lead electrodes, and the adhesion reinforcing portion is a through hole which is formed, penetrating between both the major surfaces of the substrate,
    the first major surface of the substrate and a through wall surface of the through hole constitute an adhesion surface to the conductive adhesive, and
    the entirely of the wall surface of the through hole is inclined in the same direction from the first major surface toward the second major surface.

3. A piezoelectric resonator plate in which excitation electrodes having different potentials and lead electrodes connected to the excitation electrodes so as to electrically connect the excitation electrodes to external electrodes are provided on a substrate having first and second major surfaces, and the lead electrodes are connected via a conductive adhesive to the external electrodes, wherein
    an electrode forming region for providing the lead electrodes is set on the substrate,
    an adhesion reinforcing portion for reinforcing adhesion to the conductive adhesive is provided in the electrode forming region for the lead electrodes on the first major surface of the substrate, and the adhesion reinforcing portion is a hole with a base surface which is formed on the first major surface of the substrate,
    the first major surface of the substrate and a wall surface of the hole with the base surface constitute an adhesion surface to the conductive adhesive, and
    at least a portion of the wall surface of the hole with the base surface is inclined toward the plane of the second major surface.

4. The piezoelectric resonator plate according to claim 1, wherein an extended electrode portion formed by extending the lead electrode is provided on the adhesion surface of the adhesion reinforcing portion.

5. The piezoelectric resonator plate according to claim 4, wherein the extended electrode portion is formed on an entirety of the adhesion surface of the adhesion reinforcing portion.

6. The piezoelectric resonator plate according to claim 4, wherein the extended electrode portion is formed on a portion of the adhesion surface of the adhesion reinforcing portion.

7. The piezoelectric resonator plate according to claim 1, wherein the electrode is formed by disposing and inclining one major surface of the substrate with respect to a vapor deposition source which is an electrode material, and performing vacuum vapor deposition.

8. The piezoelectric resonator plate according to claim 1, wherein the electrode is formed by sputtering.

9. The piezoelectric resonator plate according to claim 1, wherein the adhesion reinforcing portion or the adhesion reinforcing electrode portion has a step portion, and the step portion is included in the adhesion surface.

10. The piezoelectric resonator plate according to claim 1, wherein the substrate is made of an anisotropic material.

11. The piezoelectric resonator plate according to claim 1, wherein the substrate is formed of a crystal piece, and the lead electrode is formed of a multilayer film having a lowermost layer made of chromium.

12. A piezoelectric resonator device in which a housing is composed of a base and a lid, an inner portion of the housing being hermetically enclosed by adhering the base and the lid together, and
    electrode pads constituting the external electrodes are provided on the base inside the housing, and the adhesion surface of the piezoelectric resonator plate according to claim 1 is adhered to the electrode pads via a conductive adhesive.

13. The piezoelectric resonator device according to claim 12, wherein a material for the conductive adhesive includes silicone, and
    the lead electrode of the piezoelectric resonator plate is formed of a multilayer film having an uppermost layer made of chromium.

14. The piezoelectric resonator plate according to claim 2, wherein an extended electrode portion formed by extending the lead electrode is provided on the adhesion surface of the adhesion reinforcing portion.

15. The piezoelectric resonator plate according to claim 3, wherein an extended electrode portion formed by extending the lead electrode is provided on the adhesion surface of the adhesion reinforcing portion.

16. The piezoelectric resonator plate according to claim 2, wherein the conductive adhesive is a conductive polymeric adhesive.

17. The piezoelectric resonator plate according to claim 3, wherein the conductive adhesive is a conductive polymeric adhesive.

* * * * *